(12) United States Patent
Wu

(10) Patent No.: US 10,756,737 B1
(45) Date of Patent: Aug. 25, 2020

(54) OFF CHIP DRIVER CIRCUIT, OFF CHIP DRIVER COMPENSATION SYSTEM AND SIGNAL COMPENSATION METHOD

(71) Applicant: NANYA TECHNOLOGY CORPORATION, New Taipei (TW)

(72) Inventor: Chang-Ting Wu, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/581,738

(22) Filed: Sep. 24, 2019

(51) Int. Cl.
*H03K 19/018* (2006.01)
*H03K 19/0185* (2006.01)
*H03K 19/20* (2006.01)

(52) U.S. Cl.
CPC ..... *H03K 19/018585* (2013.01); *H03K 19/20* (2013.01)

(58) Field of Classification Search
CPC .................. H03K 19/018585; H03K 19/20
See application file for complete search history.

(56) References Cited

U.S. PATENT DOCUMENTS

| | | | | |
|---|---|---|---|---|
| 5,134,311 | A * | 7/1992 | Biber | H03K 19/0005 326/30 |
| 5,602,494 | A | 2/1997 | Sundstrom | |
| 6,242,942 | B1 * | 6/2001 | Shamarao | H03K 17/164 326/27 |
| 6,281,709 | B1 | 8/2001 | Seyyedy | |
| 6,573,753 | B1 | 6/2003 | Snyder | |
| 6,894,547 | B2 * | 5/2005 | Takahashi | H03K 19/01858 326/87 |
| 7,051,130 | B1 * | 5/2006 | Horowitz | G06F 13/4086 326/30 |
| 7,202,702 | B2 * | 4/2007 | Arnold | H03K 19/00384 326/83 |
| 7,265,585 | B2 * | 9/2007 | Le | H03K 19/00323 326/27 |
| 7,355,453 | B2 * | 4/2008 | Watt | H03K 17/145 326/30 |
| 7,525,357 | B2 * | 4/2009 | Kuzmenka | H04L 25/0278 327/108 |
| 7,652,520 | B2 * | 1/2010 | Gatta | H01L 27/0705 327/436 |
| 8,531,898 | B2 * | 9/2013 | Seol | G11C 5/063 365/189.05 |
| 10,566,968 | B1 * | 2/2020 | Son | H03K 17/164 |
| 2003/0112042 | A1 | 6/2003 | Takahashi | |
| 2005/0083766 | A1 * | 4/2005 | Kim | G11C 7/1051 365/230.05 |

* cited by examiner

*Primary Examiner* — Thomas J. Hiltunen
(74) *Attorney, Agent, or Firm* — CKC & Partners Co., LLC

(57) ABSTRACT

An OCD circuit includes a pull-up circuit, a pull-down circuit, a first and a second compensation circuit. The pull-up circuit is enabled in response to an input data. The pull-down circuit is enabled in response to the input data. The first compensation circuit is coupled to the pull-up circuit and configured to induce a first compensation signal to the pull-up circuit in response to a first decision signal. The second compensation circuit is coupled to the pull-down circuit and configured to induce a second compensation signal to the pull-down circuit in response to a second decision signal. The first decision signal and the second decision signal are generated in response to the input data.

16 Claims, 10 Drawing Sheets

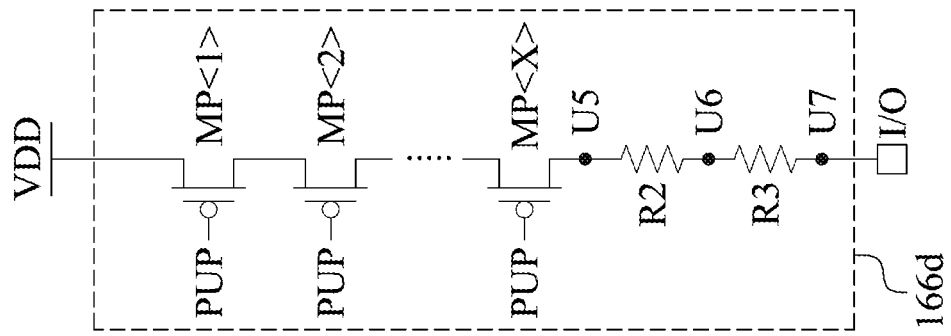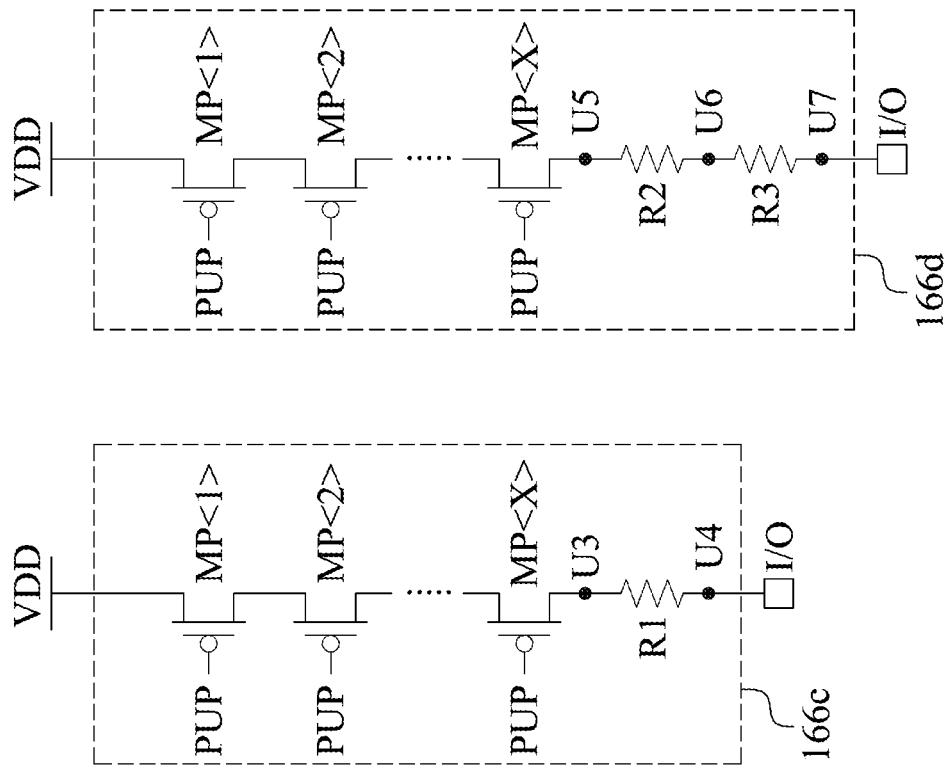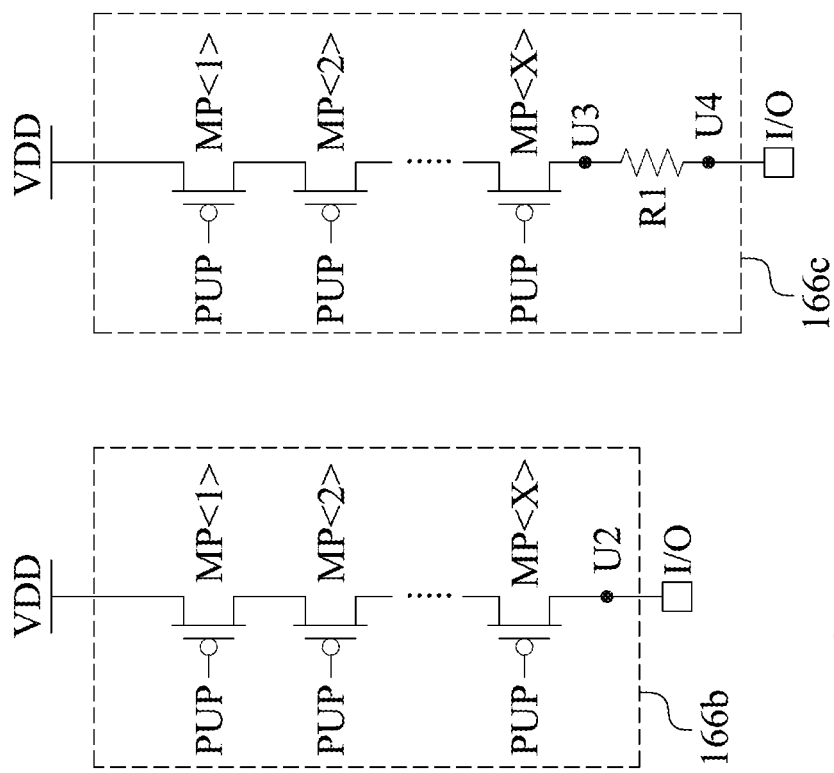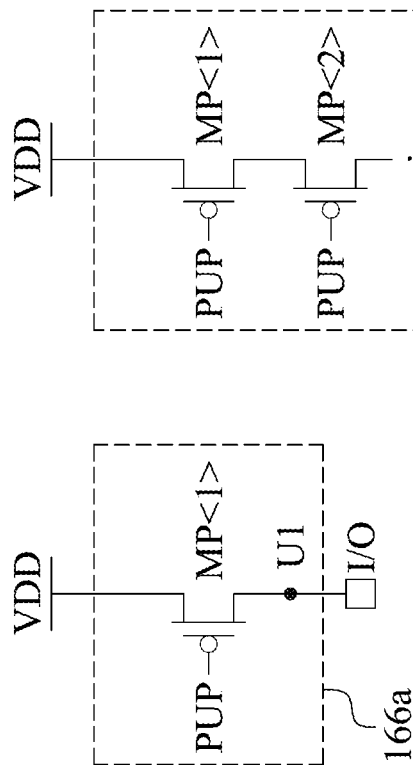
Fig. 3D
Fig. 3C
Fig. 3B
Fig. 3A

OFF CHIP DRIVER CIRCUIT, OFF CHIP DRIVER COMPENSATION SYSTEM AND SIGNAL COMPENSATION METHOD

BACKGROUND

Technical Field

The disclosure relates to an off chip driver circuit, an off chip driver compensation system and a signal compensation method, particularly to an off chip driver circuit, an off chip driver compensation system and a signal compensation method for improving signal distortion.

Description of Related Art

With development of technology, the operation speed of the memory becomes faster and faster. In high speed data transmission, the amplitude of signal is attenuated, causing signal distortion.

Therefore, how to improve signal distortion in high speed data transmission is an important issue in this field.

SUMMARY

One aspect of the present disclosure is an off chip driver circuit including a pull-up circuit, a pull-down circuit, a first compensation circuit and a second compensation circuit. The pull-up circuit is configured to be enabled in response to an input data. The pull-down circuit is configured to be enabled in response to the input data. The first compensation circuit is coupled to the pull-up circuit and configured to induce a first compensation signal to the pull-up circuit in response to a first decision signal. The second compensation circuit is coupled to the pull-down circuit and configured to induce a second compensation signal to the pull-down circuit in response to a second decision signal. The first decision signal and the second decision signal are generated in response to the input data.

Another aspect of the present disclosure is an off chip driver compensation system including a decision circuit and an OCD driver circuit. The decision circuit is configured to output a first decision signal and a second decision signal according to a clock and an input data. The OCD driver circuit is coupled to the decision circuit. The OCD driver circuit includes a pull-up circuit, a pull-down circuit, a first compensation circuit and a second compensation circuit. The pull-up circuit is configured to be enabled in response to the input data. The pull-down circuit is configured to be enabled in response to the input data. The first compensation circuit is coupled to the pull-up circuit and configured to induce a first compensation signal to the pull-up circuit in response to the first decision signal. The second compensation circuit is coupled to the pull-down circuit and configured to induce a second compensation signal in response to the second decision signal.

Another aspect of the present disclosure is a signal compensation method. The signal compensation method includes: enabling a pull-up circuit in response to an input data; turning a first decision signal to a high level when the input data turns from a first level to a second level; inducing a first compensation signal to the pull-up circuit in response to the first decision signal; enabling a pull-down circuit in response to the input data; turning a second decision signal to a low level when the input data turns from the second level to the first level; and inducing a second compensation signal to the pull-down circuit in response to the second decision signal.

Another aspect of the present disclosure is a driver. The driver includes a decision circuit, a driving circuit and a compensation circuit. The decision circuit is configured to provide a decision signal in response to a clock and an input data. The driving circuit is configured to provide a driving signal in response to the input data. The compensation circuit is coupled to the driving circuit and configured to induce a compensation signal to the driving circuit in response to the decision signal.

BRIEF DESCRIPTION OF THE DRAWINGS

FIGS. 3A~3D are schematic diagrams illustrating pull-up circuits in accordance with some embodiments of the disclosure.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

In this document, the term "coupled" may also be termed "electrically coupled," and the term "connected" may be termed "electrically connected." "Coupled" and "connected" may also be used to indicate that two or more elements cooperate or interact with each other.

Figure 1:
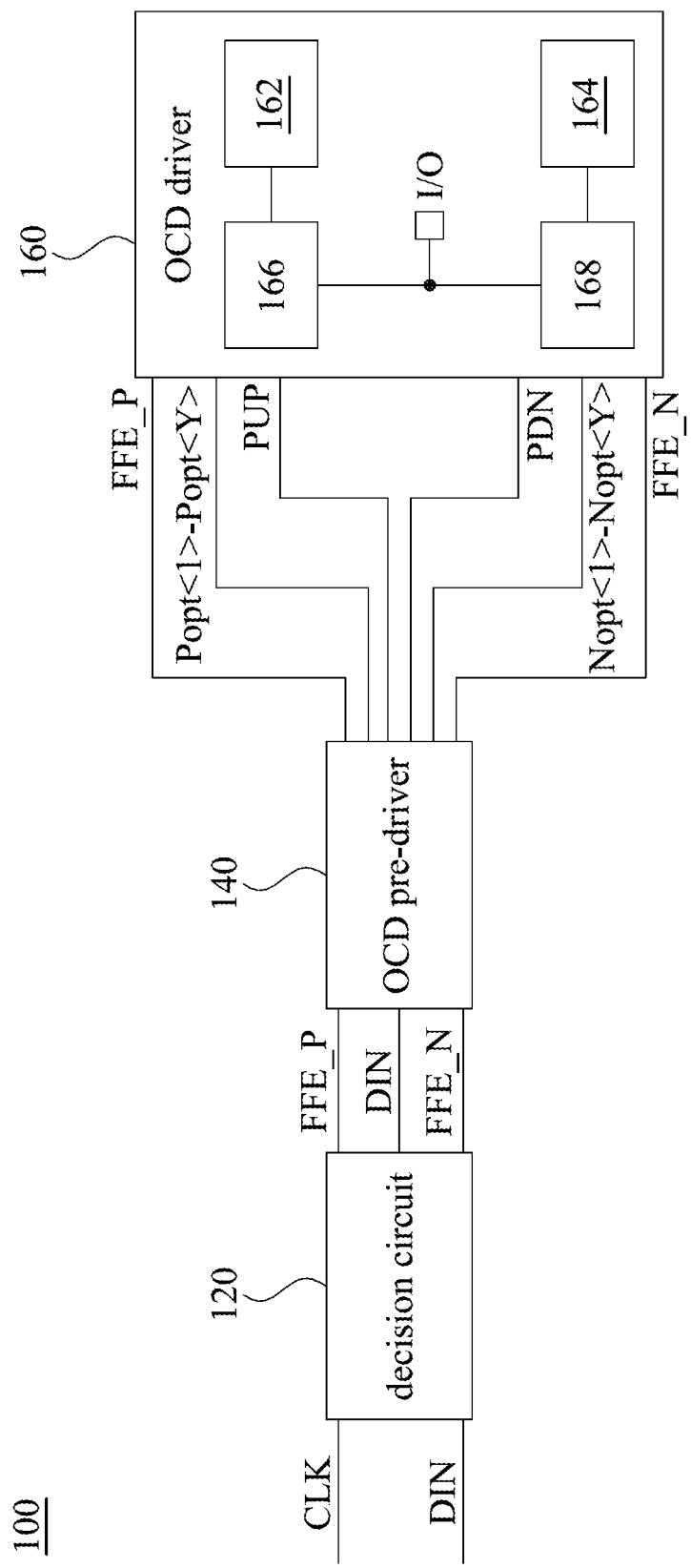
FIG. 1 is a schematic diagram illustrating an off chip driver compensation system in accordance with some embodiments of the disclosure.

Please refer to FIG. 1. FIG. 1 is a schematic diagram illustrating an off chip driver compensation system 100 in accordance with some embodiments of the disclosure. As shown in FIG. 1, the off chip driver compensation system 100 includes a decision circuit 120, an off chip drive (OCD) pre-driver 140 and an off chip drive (OCD) driver 160. In structure, the decision circuit 120 is coupled to the OCD pre-driver 140. The OCD pre-driver 140 is coupled to the OCD driver 160.

In configurationally, the decision circuit 120 is configured to receive a clock CLK and an input data DIN, and to output a first decision signal FFE_P and a second decision signal FFE_N according to the input data DIN. The OCD pre-driver 140 is configured to receive the input data DIN, the first decision signal FFE_P and the second decision signal FFE_N, and to output a pull-up control signal PUP, a pull-down control signal PDN, one or more first optional signals Popt<1>~Popt<Y> and one or more second optional signals Nopt<1>~Nopt<Y>. The OCD driver 160 is configured to receive the first decision signal FFE_P, the second decision signal FFE_N, the first optional signals Popt<1>~Popt<Y>, the second optional signals Nopt<1>~Nopt<Y>, the pull-up control signal PUP and the pull-down control signal PDN, and to induce an output signal corresponding to an input/output pad I/O.

Figure 2:
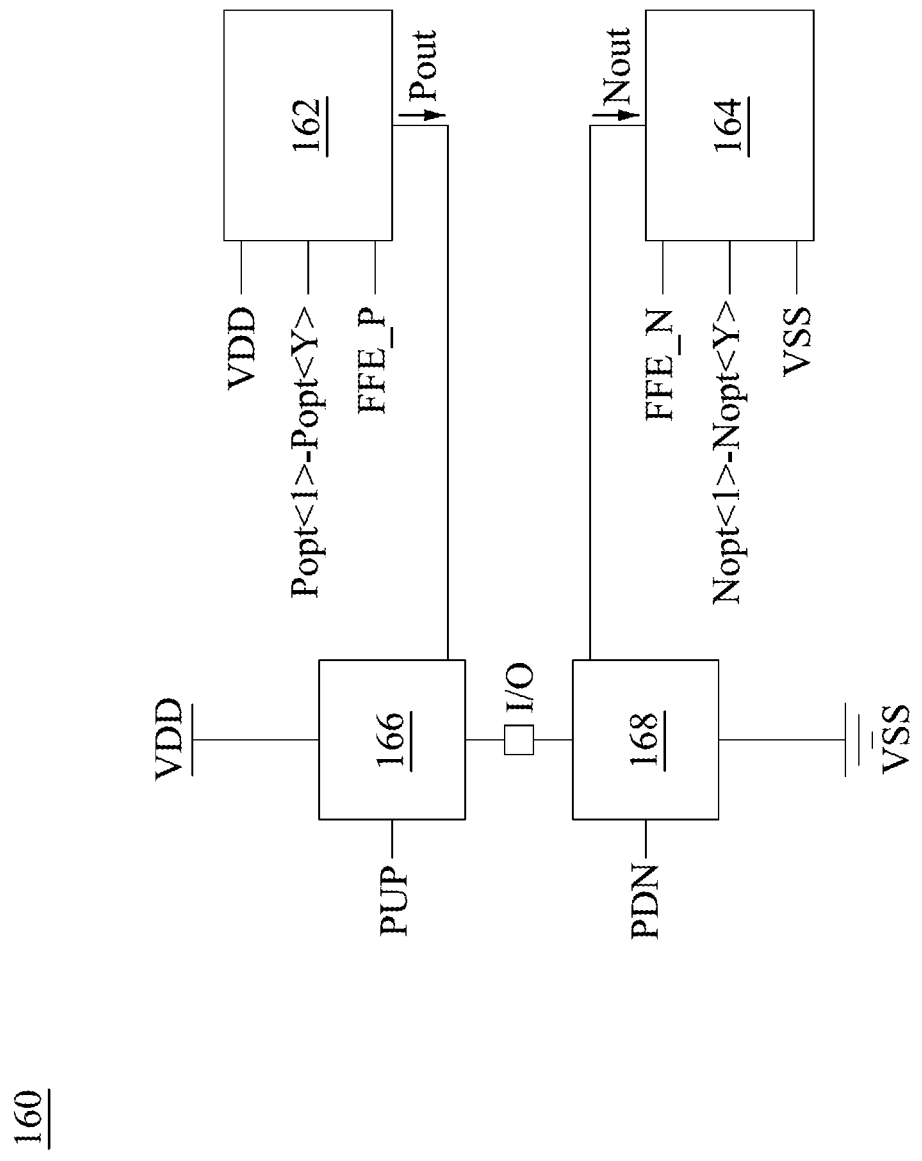
FIG. 2 is a schematic diagram illustrating an off chip driver circuit in accordance with some embodiments of the disclosure.
Figure 4D:
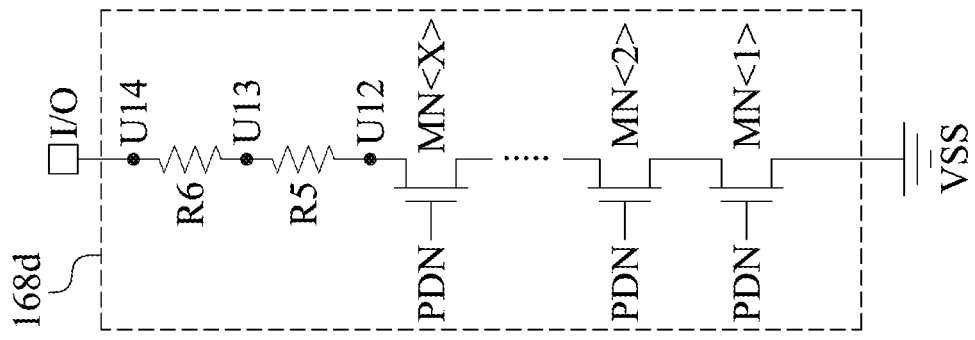
FIGS. 4A~4D are schematic diagrams illustrating pull-down circuits in accordance with some embodiments of the disclosure.
Figure 4C:
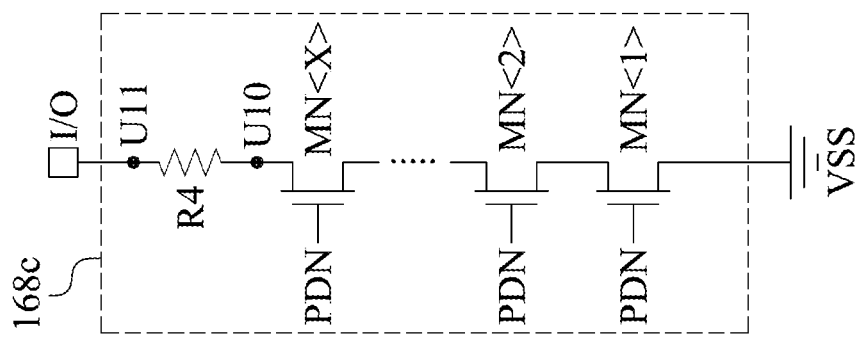
Figure 4B:
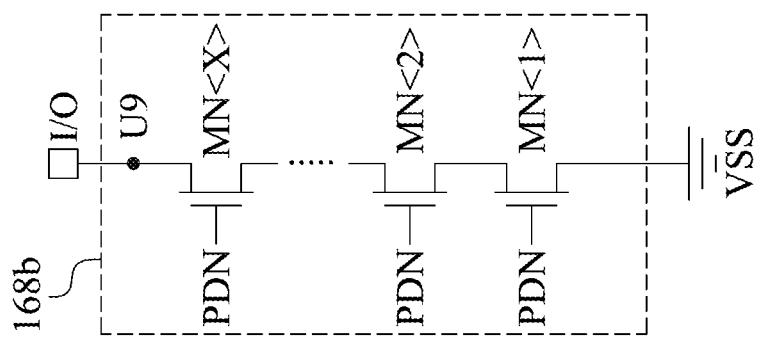
Figure 4A:
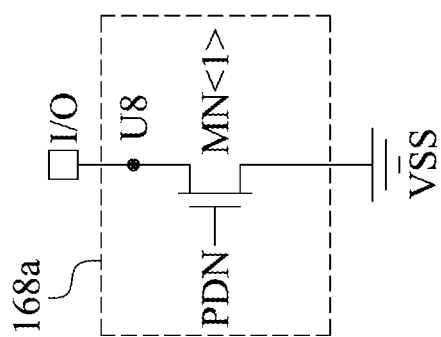

Please refer to FIG. 2. FIG. 2 is a schematic diagram illustrating an off chip driver circuit 160 in accordance with some embodiments of the disclosure. As shown in FIG. 2, in some embodiments, the OCD driver 160 includes a pull-up circuit 166, a pull-down circuit 168, a first compensation circuit 162 and a second compensation circuit 164. In structure, the first compensation circuit 162 is coupled to the pull-up circuit 166. The second compensation circuit 164 is coupled to the pull-down circuit 168. The pull-up circuit 166 and the pull-down circuit 168 are coupled at the input/output pad I/O.

In configurationally, the first compensation circuit 162 is configured to receive a system high voltage VDD, the first optional signals Popt<1>~Popt<Y> and the first decision signal FFE_P, and to induce a first compensation signal Pout to the pull-up circuit 166 corresponding to the input/output pad I/O according to a signal compensation method. The pull-up circuit 166 is configured to receive the system high voltage VDD and the pull-up control signal PUP, and to induce a pull-up driving signal corresponding to the input/output pad I/O. Similarly, the second compensation circuit 164 is configured to receive a system low voltage VSS, the second optional signals Nopt<1>~Nopt<Y> and the second decision signal FFE_N, and to induce a second compensation signal Nout to the pull-down circuit 168 corresponding to the input/output pad I/O according to the signal compensation method. The pull-down circuit 168 is configured to receive the system low voltage VSS and the pull-down control signal PDN, and to induce a pull-down driving signal corresponding to the input/output pad I/O.

About the detail description of the pull-up circuit 166, please refer to FIGS. 3A~3D. FIGS. 3A~3D are schematic diagrams illustrating pull-up circuits 166a~166d in accordance with some embodiments of the disclosure. In some embodiments, the pull-up circuit 166 in FIG. 2 may be realized by the pull-up circuit 166a includes a transistor MP<1>, as shown in FIG. 3A. A first terminal of the transistor MP<1> is coupled to the system high voltage VDD. A second terminal of the transistor MP<1> is coupled to the input/output pad I/O. A control terminal of the transistor MP<1> is configured to receive the pull-up control signal PUP. The transistor MP<1> is configured to be conducted according to the pull-up control signal PUP with a low level, so as to induce the pull-up driving signal corresponding to the input/output pad I/O. In this embodiment, the first compensation circuit 162 may be coupled to the second terminal of the transistor MP<1> (i.e., node U1).

In some other embodiments, the pull-up circuit 166 in FIG. 2 may be realized by the pull-up circuit 166b includes multiple transistors MP<1>~MP<X> connected in series, as shown in FIG. 3B, or be realized by the pull-up circuit 166c includes multiple transistors MP<1>~MP<X> and a resistor R1 connected in series, as shown in FIG. 3C, or be realized by the pull-up circuit 166d includes multiple transistors MP<1>~MP<X> and multiple resistors R2, R3 connected in series, as shown in FIG. 3D, in which X is an integer. The structure and operation of the transistors MP<2>~MP<X> is similar to the transistor MP<1>, thus the explanation is omitted. In these embodiments, the first compensation circuit 162 may be coupled to the second terminal of the transistor MP<X> (i.e., node U2, U3, U5), or be coupled between the resistor R1 and the input/output pad I/O (i.e., node U4, U7), or be coupled between the resistors R2 and R3 (i.e., node U6).

About the detail description of the pull-down circuit 168, please refer to FIGS. 4A~4D. FIGS. 4A~4D are schematic diagrams illustrating pull-down circuits 168a~168d in accordance with some embodiments of the disclosure. In some embodiments, the pull-down circuit 168 in FIG. 2 may be realized by the pull-down circuit 168a~168d, as shown in FIGS. 4A~4D, respectively. The pull-down circuit 168 is similar to the pull-up circuit 166, but the p-typed transistors MP<1>~MP<X> are replaced by n-typed transistors MN<1>~MN<X>, the pull-up control signal PUP is replaced by the pull-down control signal PDN, and the system high voltage VDD is replaced by the system low voltage VSS. For the sake of brevity, the further detail explanation is not repeated herein.

It should be noted that the pull-up circuit 166a~166d and the pull-down circuit 168a~168d are merely examples, and not intended to limit the present disclosure. Any circuit that implements the pull-up driver and the pull-down driver is within the scope of this disclosure. That is, the design of the pull-up circuit and the pull-down circuit may be adjusted by those of ordinary skills in the art.

Figure 5:
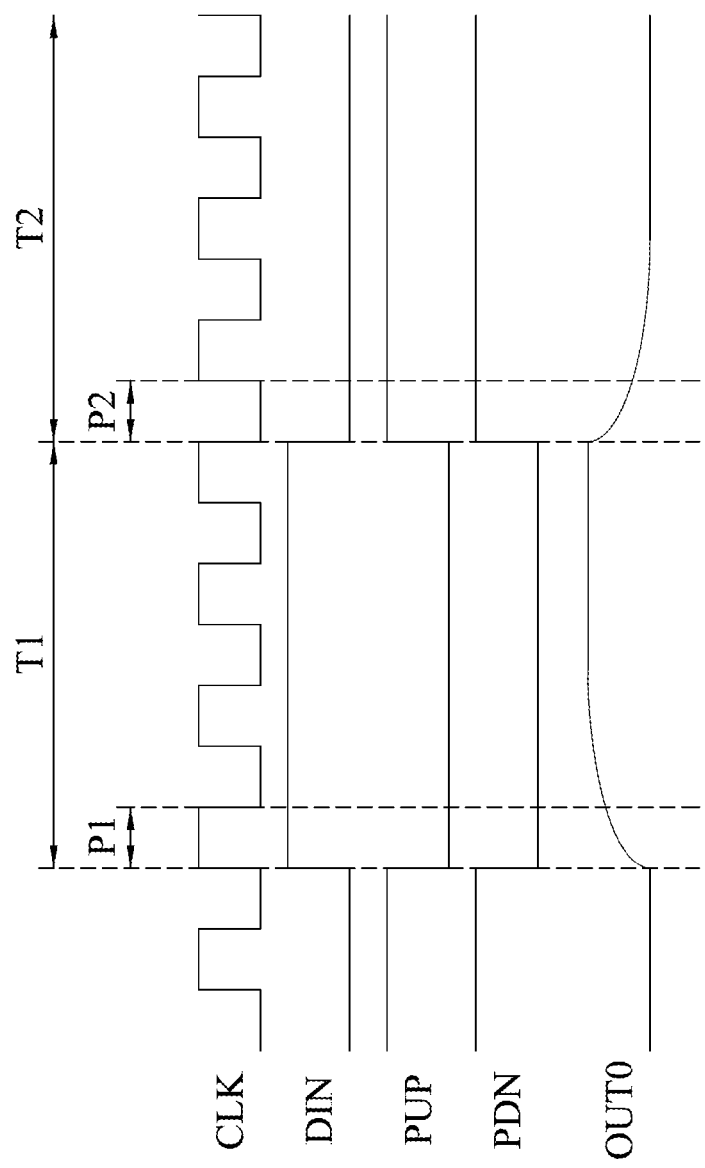
FIG. 5 is a schematic diagram illustrating signals of an off chip driver compensation system in accordance with some embodiments of the disclosure.

Please refer to FIG. 1, FIG. 2 and FIG. 5 together. FIG. 5 is a schematic diagram illustrating signals of an off chip driver compensation system 100 in accordance with some embodiments of the disclosure. As shown in FIG. 5, in a time period T1, the input data DIN is at high level. The OCD pre-driver 140 generates and outputs the pull-up control signal PUP with a low level according to the input data DIN being at high level. The pull-up circuit 166 is conducted according to the pull-up control signal PUP with the low level, so as to provide the system high voltage VDD to the input/output pad I/O.

On the other hand, in a time period T2, the input data DIN is at low level. The OCD pre-driver 140 generates and outputs the pull-down control signal PDN with the high level according to the input data DIN being at low level. The pull-down circuit 168 is conducted according to the pull-down control signal PDN with the high level, so as to provide the system low voltage VSS to the input/output pad I/O.

In this way, the output signal of the input/output pad I/O should ideally be the same as the input data DIN. However, in high speed data transmission, as shown in FIG. 5, at the beginning of the input data DIN turning from low level to high level, the first output data of the output signal OUT0, as the waveform of the time period P1 shown in FIG. 5, is too low to be clear. Similarly, at the beginning of the input data DIN turning from high level to low level, the first output data of the output signal OUT0, as the waveform of the time period P2 shown in FIG. 5, is too high to be clear. Therefore, in the present disclosure, the first compensation circuit 162 is able to induce the first compensation signal Pout to the pull-up circuit 166 corresponding to the input/output pad I/O according to the signal compensation method, and the second compensation circuit 164 is able to induce the second compensation signal Nout to the pull-down circuit 168 corresponding to the input/output pad I/O according to the signal compensation method, so that the output signal of the input/output pad I/O is able to be clearer (less distortion). About the signal compensation method will be described in the following paragraphs.

Figure 6:
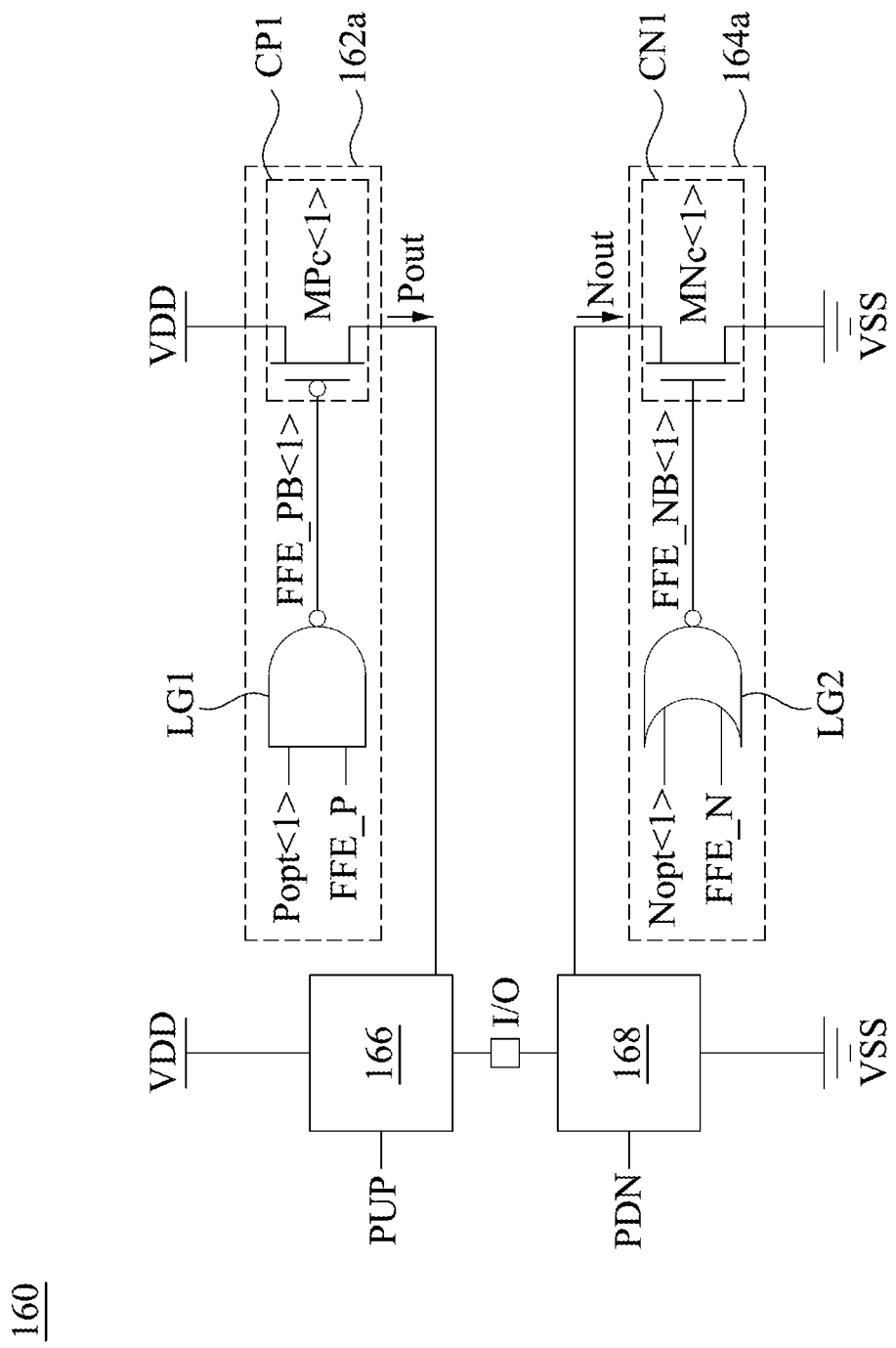
FIG. 6 is a schematic diagram illustrating another off chip driver circuit in accordance with some other embodiments of the disclosure.
Figure 7:
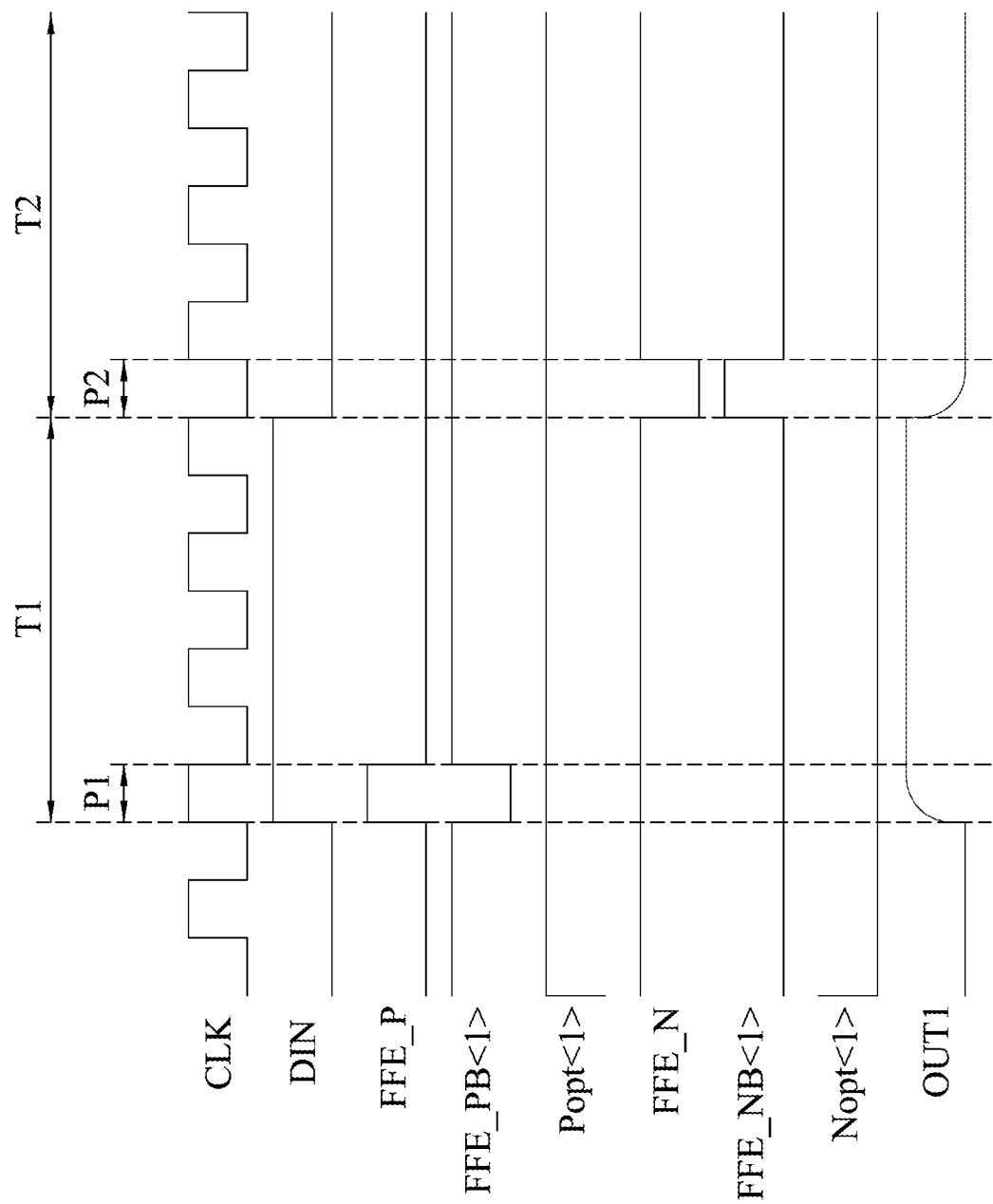
FIG. 7 is a schematic diagram illustrating signals of an off chip driver circuit in accordance with some embodiments of the disclosure.

Please refer to FIG. 6 and FIG. 7. FIG. 6 is a schematic diagram illustrating another off chip driver circuit 160 in accordance with some other embodiments of the disclosure. FIG. 7 is a schematic diagram illustrating signals of an off chip driver circuit 160 in accordance with some embodiments of the disclosure. In some embodiments, the first compensation circuit 162a shown in FIG. 6 may be realized the first compensation circuit 162 in FIG. 2, and the second compensation circuit 164a shown in FIG. 6 may be realized the second compensation circuit 164 in FIG. 2. For the convenience of explanation, the operation of the first compensation circuit 162a and the second compensation circuit 164a illustrated in FIG. 6 is explained with accompanying of the signals of FIG. 7. It should be noted that the first compensation circuit 162 and the second compensation circuit 164 may include one or more compensation components including one or more transistors. For convenience and clarity of explanation, the following description will be explained first with a first compensation component CP1 including a first transistor and a second compensation component CN1 including a second transistor as an example.

In some embodiments, as shown in FIG. 6, the first compensation circuit 162a includes a NAND circuit LG1 and a first transistor MPc<1>. A first terminal of the first transistor MPc<1> is coupled to the system high voltage VDD. A second terminal of the first transistor MPc<1> is coupled to the pull-up circuit 166. A control terminal of the first transistor MPc<1> is coupled to the NAND circuit LG1. In configurationally, the NAND circuit LG1 is configured to receive the first optional signal Popt<1> and the first decision signal FFE_P, to generate a enable signal FFE_PB<1> according to the first optional signal Popt<1> and the first decision signal FFE_P, and to output the enable signal FFE_PB<1> to the control terminal of the first transistor MPc<1>. And the first transistor MPc<1> is configured to be conducted according to the enable signal FFE_PB<1> with the low level, so as to provide the system high voltage VDD as the first compensation signal Pout to the pull-up circuit 166.

For example, the first optional signal Popt<1> is at high level as shown in FIG. 7. When the first decision signal FFE_P is at low level, the enable signal FFE_PB<1> generated by the NAND circuit LG1 is at high level. In time period P1, when the first decision signal FFE_P is at high level, the enable signal FFE_PB<1> generated by the NAND circuit LG1 is at low level. As the enable signal FFE_PB<1> is at the low level (i.e., the low level shown in time period P1 of FIG. 7), the first transistor MPc<1> is conducted according to the enable signal FFE_PB<1>, so that the system high voltage VDD is provided to the pull-up circuit 166 to make the output signal OUT1 become high level earlier in time period P1.

Similarly, the second compensation circuit 164a includes a NOR circuit LG2 and a second transistor MNc<1>. A first terminal of the second transistor MNc<1> is coupled to the system low voltage VSS. A second terminal of the second transistor MNc<1> is coupled to the pull-down circuit 168. A control terminal of the second transistor MNc<1> is coupled to the NOR circuit LG2. In configurationally, the NOR circuit LG2 is configured to receive the second optional signal Nopt<1> and the second decision signal FFE_N, to generate a enable signal FFE_NB<1> according to the second optional signal Nopt<1> and the second decision signal FFE_N, and to output the enable signal FFE_NB<1> to the control terminal of the second transistor MNc<1>. And the second transistor MNc<1> is configured to be conducted according to the enable signal FFE_NB<1> with the high level, so as to provide the system low voltage VSS as the second compensation signal Nout to the pull-down circuit 168.

For example, the second optional signal Nopt<1> is at low level as shown in FIG. 7. When the second decision signal FFE_N is at high level, the enable signal FFE_NB<1> generated by the NOR circuit LG2 is at low level. In time period P2, when the second decision signal FFE_N is at low level, the enable signal FFE_NB<1> generated by the NOR circuit LG2 is at high level. As the enable signal FFE_NB<1> is at the high level (i.e., the high level shown in time period P2 of FIG. 7), the second transistor MNc<1> is conducted according to the enable signal FFE_NB<1>, so that the system low voltage VSS is provided to the pull-down circuit 168 to make the output signal OUT1 become low level earlier in time period P2.

In this way, by the first compensation circuit 162a inducing the first compensation signal Pout corresponding to the input/output pad I/O, at the beginning of the input data DIN turning from low level to high level, the first output data of the output signal OUT1, as the waveform of the time period P1 shown in FIG. 7, is able to be clear. Similarly, by the second compensation circuit 164a inducing the second compensation signal Nout corresponding to the input/output pad I/O, at the beginning of the input data DIN turning from high level to low level, the first output data of the output signal OUT1, as the waveform of the time period P2 shown in FIG. 7, is also able to be clear.

In some embodiments, the first decision signal FFE_P and the second decision signal FFE_N are generated by the decision circuit 120 according to the input data DIN and the clock CLK. Specifically, the decision circuit 120 receives the input data DIN and compares the voltage level of the next input data and the present one. When the voltage level of the next input data is higher than the voltage level of the present input data, the decision circuit 120 generates a pulse of the first decision signal FFE_P (as the waveform show in time period P1 of FIG. 7). When the voltage level of the next input data is lower than the voltage level of the present input data, the decision circuit 120 generates a pulse of the second decision signal FFE_N (as the waveform show in time period P2 of FIG. 7). In some embodiments, the decision circuit 120 may be realized by a feed forward equalizer.

Figure 8:
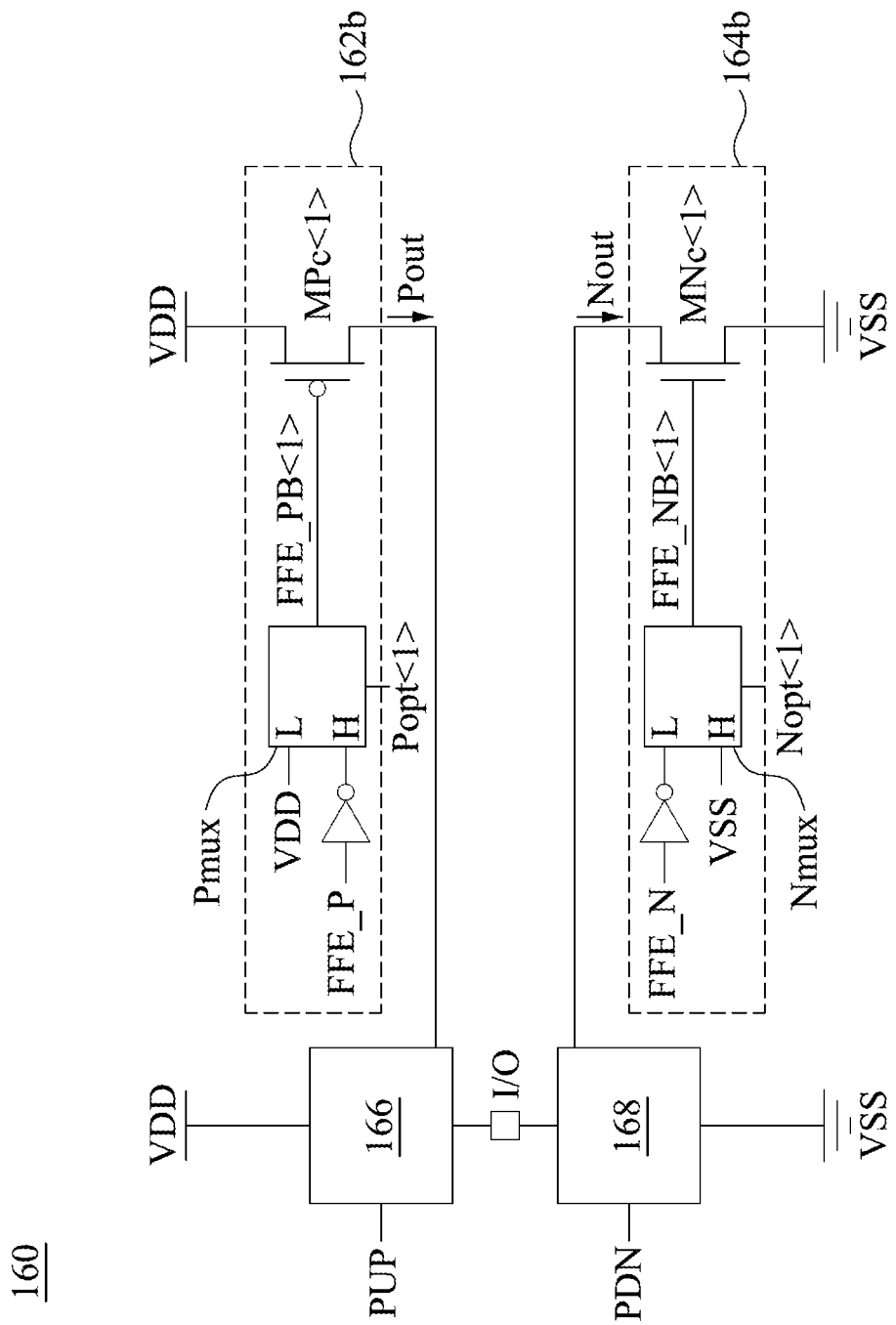
FIG. 8 is a schematic diagram illustrating another off chip driver circuit in accordance with some other embodiments of the disclosure.

Please refer to FIG. 8. FIG. 8 is a schematic diagram illustrating another off chip driver circuit 160 in accordance with some other embodiments of the disclosure. In some embodiments, the first compensation circuit 162b shown in FIG. 8 may be realized the first compensation circuit 162 in FIG. 2, and the second compensation circuit 164b shown in FIG. 8 may be realized the second compensation circuit 164 in FIG. 2. In FIG. 8, similar elements related to the embodiments in FIG. 6 are represented by the same reference symbols for ease of understanding, and the detail explanation is omitted. In the embodiments of FIG. 8, compared to the embodiments of FIG. 6, the first compensation circuit 162b includes a multiplexer Pmux and the first transistor MPc<1>, and the second compensation circuit 164b includes a multiplexer Nmux and a second transistor MNc<1>.

As shown in FIG. 8, the control terminal of the first transistor MPc<1> is coupled to an output terminal of the multiplexer Pmux. An input terminal with pin of the multiplexer Pmux is coupled to the system high voltage VDD. An input terminal with 'H' pin of the multiplexer Pmux is coupled to a NOT gate receiving the first decision signal FFE_P. A control terminal of the multiplexer Pmux is configured to receive the first optional signal Popt<1>. The multiplexer Pmux is configured to output one of signals receiving by the two input terminals according to the first optional signal Popt<1>.

For example, when the first optional signal Popt<1> is at high level as shown in FIG. 7, the multiplexer Pmux outputs the signal of input terminal with 'H' pin. And due to the NOT gate, the enable signal FFE_PB<1> is at high level when the first decision signal FFE_P is at low level, and the enable signal FFE_PB<1> is at low level when the first decision signal FFE_P is at high level, as the waveform shown in time period P1 of FIG. 7.

Similarly, as shown in FIG. 8, the control terminal of the second transistor MNc<1> is coupled to an output terminal of the multiplexer Nmux. An input terminal with 'H' pin of the multiplexer Nmux is coupled to the system low voltage VSS. An input terminal with pin of the multiplexer Nmux is coupled to a NOT gate receiving the second decision signal FFE_N. A control terminal of the multiplexer Nmux is configured to receive the second optional signal Nopt<1>. The multiplexer Nmux is configured to output one of signals receiving by the two input terminals according to the second optional signal Nopt<1>.

For example, when the second optional signal Nopt<1> is at low level as shown in FIG. 7, the multiplexer Nmux outputs the signal of input terminal with pin. And due to the NOT gate, the enable signal FFE_NB<1> is at low level when the second decision signal FFE_N is at high level, and the enable signal FFE_NB<1> is at high level when the second decision signal FFE_N is at low level, as the waveform shown in time period P2 of FIG. 7.

In this way, similar to the NAND circuit LG1, the multiplexer Pmux and the NOT gate are able to generate the reserves signal FFE_PB<1> of the first decision signal FFE_P and to output to the first transistor MPc<1>, so that the first transistor MPc<1> is able to induce the first compensation signal Pout corresponding to the input/output pad I/O. And similar to the NOR circuit LG2, the multiplexer Nmux and the NOT gate are able to generate the reserves signal FFE_NB<1> of the second decision signal FFE_N and to output to the second transistor MNc<1>, so that the second transistor MNc<1> is able to induce the second compensation signal Nout corresponding to the input/output pad I/O.

It should be noted that the first compensation circuit 162a, 162b, the second compensation circuit 164a and 164b are merely examples, and not intended to limit the present disclosure. Any circuit or combination of logic gates that may generate signals (e.g., the reserves signals FFE_PB<1> and FFE_NB<1>) for controlling the first transistor MPc<1> and the second transistor MNc<1> is within the scope of this disclosure. That is, the design of the compensation circuits 162 and 164 may be adjusted by those of ordinary skills in the art.

Figure 9A:
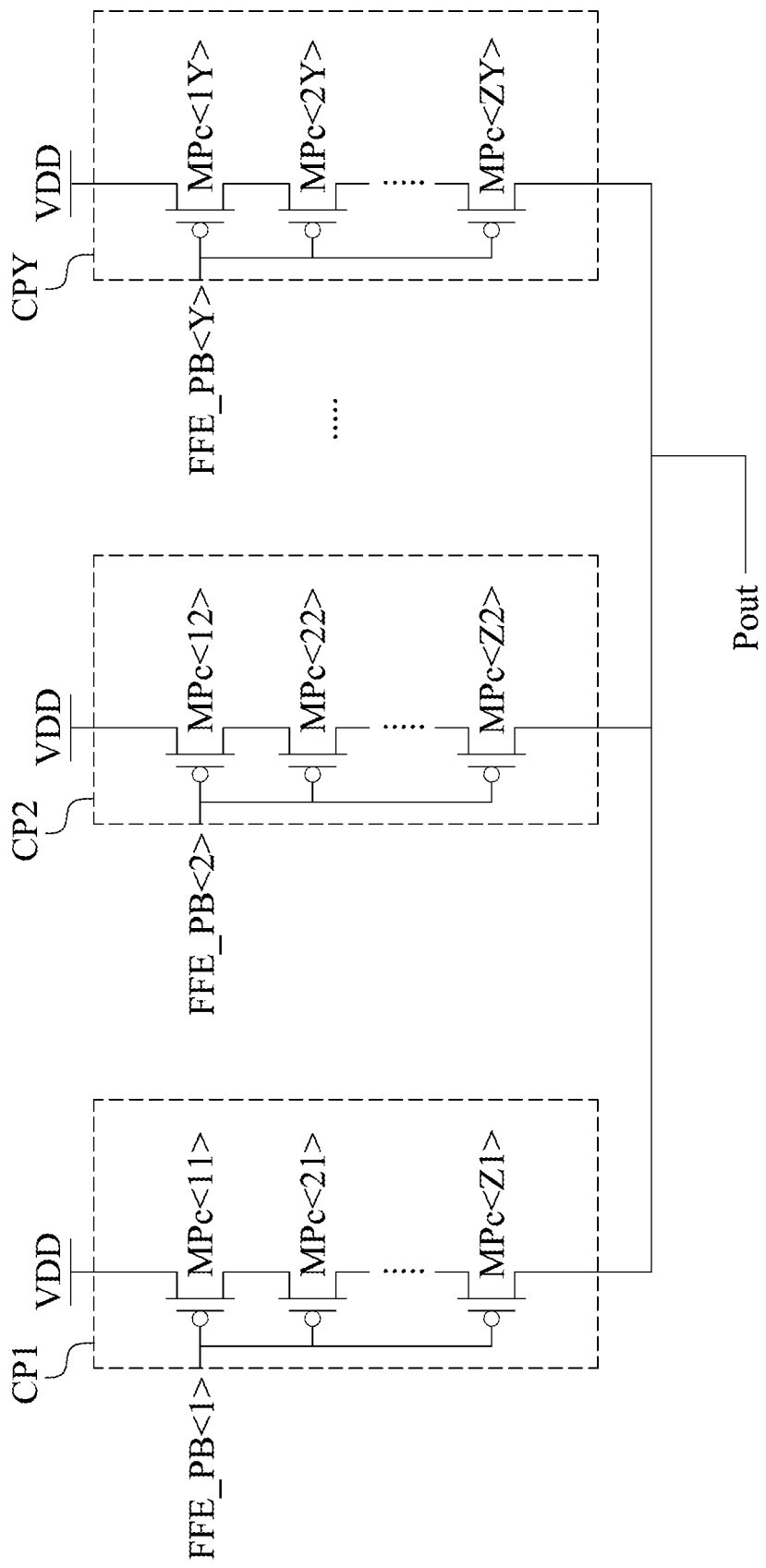
FIG. 9A is a schematic diagram illustrating multiple first compensation components of a first compensation circuit in accordance with some embodiments of the disclosure.

About the first compensation circuit 162 includes one or more first compensation components, please refer to FIG. 9A. FIG. 9A is a schematic diagram illustrating multiple first compensation components CP1~CPY of a first compensation circuit 162 in accordance with some embodiments of the disclosure. In some embodiments, as shown in FIG. 9A, the first compensation circuit 162 may include one or more first compensation components CP1~CPY, in which Y is an integer. Each of the first compensation components CP1~CPY may include one or more first transistors, such as first transistors MPc<11>~MPc<Z1> included by the first compensation component CP1, in which Z is an integer.

For example, in some embodiments, as Y=1, it means that the first compensation circuit 162 includes one first compensation component CP1. In some other embodiments, as Y=2, it means that the first compensation circuit 162 includes two first compensation components CP1~CP2. So as on, in some other embodiments, as Y=any integer k0, it means that the first compensation circuit 162 includes k0 first compensation components CP1~CPk. Similarly, in some other embodiments, as Y=1 and Z=1, it means that the first compensation circuit 162 includes one first compensation component CP1 including one first transistor MPc<11>. In some other embodiments, as Y=1, Z=2, it means that the first compensation circuit 162 includes one first compensation component CP1 including two first transistors MPc<11>~MPc<21>. So as on, in some other embodiments, as Y=1, Z=any integer k1, it means that the first compensation circuit 162 includes one first compensation component CP1 including k1 first transistors MPc<11>~MPc<(k1)1>.

In addition, it should be noted that, though the number of the first transistors of each first compensation component illustrated in FIG. 9A is the same (i.e., Z first transistors), in some other embodiments, numbers of the first transistors included by different first compensation components are different. For example, the first compensation component CP1 may include one first transistor MPc<11>, the first compensation component CP2 may include two first transistors MPc<12>~MPc<22>, and the first compensation component CP3 may include four first transistors MPc<13>~MPc<43>.

In structure, first compensation components CP1~CPY are connected in parallel, and the first transistors of the same first compensation component are connected in series. For example, the first transistors MPc<11>~MPc<Z1> of the first compensation component CP1 are connected in series, and the first transistors MPc<12>~MPc<Z2> of the first compensation component CP2 are connected in series, so as on, the first transistors MPc<1Y>~MPc<ZY> of the first compensation component CPY are connected in series. In configurationally, the first transistors of the same first compensation component are configured to receive the same enable signal corresponding to the same optional signal, and to be conducted according to the same enable signal.

For example, the first transistors MPc<11>~MPc<Z1> of the first compensation component CP1 are conducted according to the enable signal FFE_PB<1> with low level, and the enable signal FFE_PB<1> is generated by the NAND circuit LG1 or the multiplexer Pmux according to the corresponding optional signal Popt<1>. The first transistors MPc<12>~MPc<Z2> of the first compensation component CP2 are conducted according to the enable signal FFE_PB<2> with low level, and the enable signal FFE_PB<2> is generated by the NAND circuit LG1 or the multiplexer Pmux according to the corresponding optional signal Popt<2>. so as on, the first transistors MPc<1Y>~MPc<ZY> of the first compensation component CPY are conducted according to the enable signal FFE_PB<Y> with low level, and the enable signal FFE_PB<Y> is generated by the NAND circuit LG1 or the multiplexer Pmux according to the corresponding optional signal Popt<Y>.

In this way, by adjusting the number of the optional signal Popt<1>~Popt<Y>, the number of the enable signals FFE_PB<1>~FFE_PB<Y> being at the low level and the number of the first compensation components CP1~CPY conducted are able to be controlled. In other words, the number of the first optional signals is equal to the number of the first enable signals and the number of the first compensation components. Therefore, the current intensity of the compensation signal Pout may be designed by adjusting the number of the optional signals Popt<1>~Popt<Y> output by the OCD pre-driver 140.

Figure 9B:
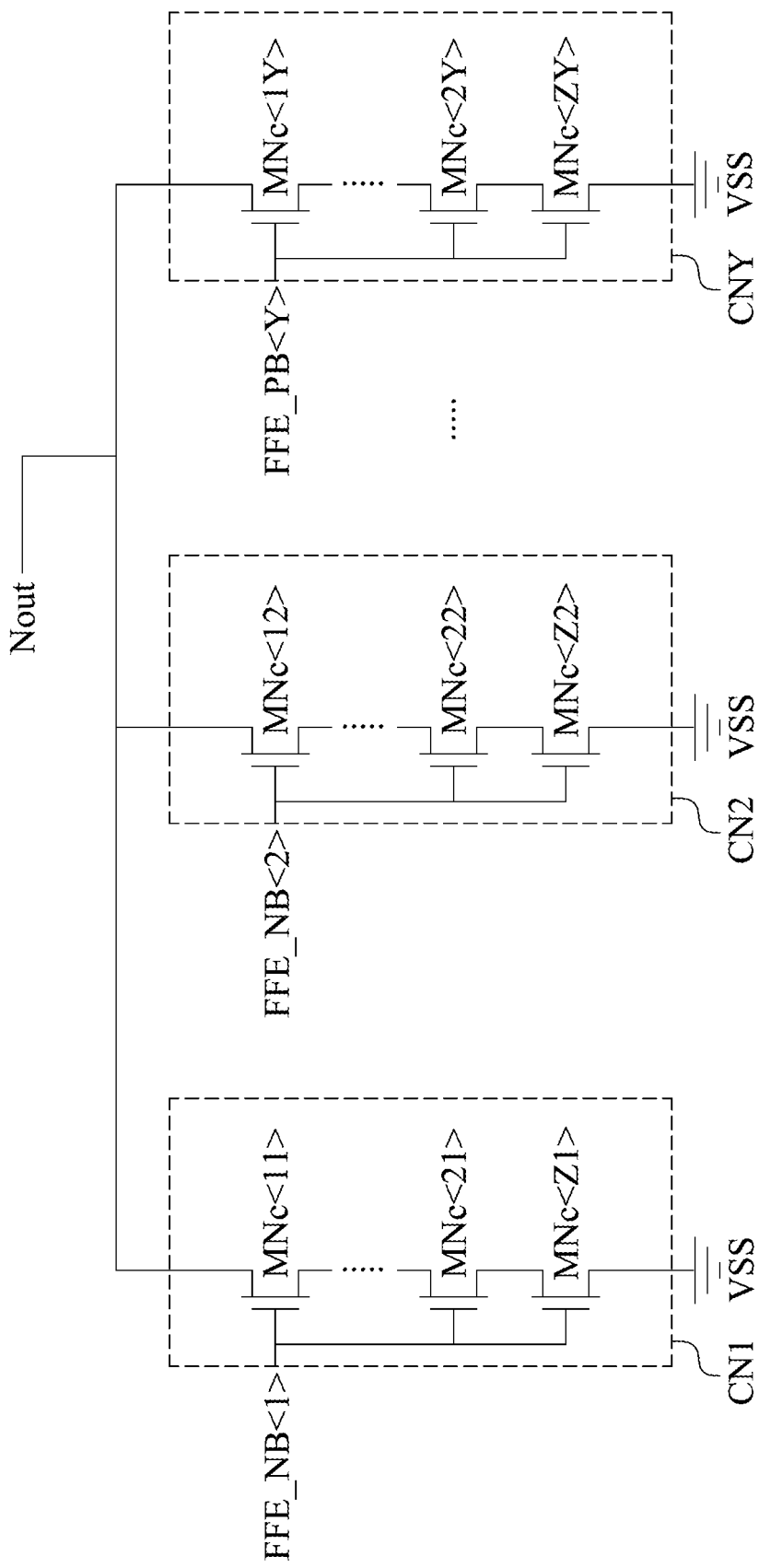
FIG. 9B is a schematic diagram illustrating multiple second compensation components of a second compensation circuit in accordance with some embodiments of the disclosure.

About the second compensation circuit 164 includes one or more second compensation components, please refer to FIG. 9B. FIG. 9B is a schematic diagram illustrating multiple second compensation components CN1~CNY of a second compensation circuit 164 in accordance with some embodiments of the disclosure. The second compensation components CN1~CNY included by the second compensation circuit 164 is similar to the first compensation components CP1~CPY included by the first compensation circuit 162, but the p-typed transistors MPc<11>~MPc<ZY> are replaced by n-typed transistors MNc<11>~MNc<ZY>, the enable signals FFE_PB<1>~FFE_PB<Y> are replaced by the enable signals FFE_NB<1>~FFE_NB<Y>, and the system high voltage VDD is replaced by the system low voltage VSS.

That is, as shown in FIG. 9B, the second compensation circuit 164 may include one or more second compensation components CN1~CNY, in which Y is an integer. Each of the second compensation components CN1~CNY may include one or more second transistors, such as second transistors MNc<11>~MNc<Z1> included by the second compensation component CN1, in which Z is an integer. In addition, it should be noted that, though the number of the second transistors of each second compensation component illustrated in FIG. 9B is the same (i.e., Z second transistors), in some other embodiments, numbers of the second transistors included by different second compensation components are different. For example, the second compensation component CN1 may include one second transistor MNc<11>, the second compensation component CN2 may include two first transistors MNc<12>~MNc<22>, and the second compensation component CN3 may include four second transistors MNc<13>~MNc<43>.

Similarly, the second transistors of the same second compensation component are configured to receive the same enable signal corresponding to the same optional signal, and to be conducted according to the same enable signal. For example, the second transistors MNc<11>~MNc<Z1> of the second compensation component CN1 are conducted according to the enable signal FFE_NB<1> with the high level, and the enable signal FFE_NB<1> is generated by the NOR circuit LG2 or the multiplexer Nmux according to the corresponding optional signal Nopt<1>.

Therefore, by adjusting the number of the optional signal Nopt<1>~Nopt<Y>, the number of the enable signals FFE_NB<1>~FFE_NB<Y> being at the high level and the number of the second compensation components CN1~CNY conducted are able to be controlled. In other words, the number of the second optional signals is equal to the number of the second enable signals and the number of the second compensation components. Therefore, the current intensity of the compensation signal Nout may be designed by adjusting the number of the optional signals Nopt<1>~Nopt<Y> output by the OCD pre-driver 140. For the sake of brevity, the further detail explanation is not repeated herein.

In the foregoing, exemplary operations are included. However, these operations do not need to be performed sequentially. The operations mentioned in the embodiment may be adjusted according to actual needs unless the order is specifically stated, and may even be performed simultaneously or partially simultaneously.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure. In addition, those skilled in the art can understand that in various embodiments, circuit units may be implemented by different types of analog or digital circuits or by different chips having integrated circuits. Components may also be integrated in a single chip having integrated circuits. The description above is merely by examples and not meant to limit the present disclosure.

In summary, in various embodiments of the present disclosure, by the compensation signal Pout, Nout generated by the compensation circuits 162, 164, the output data of the output signal OUT1 is able to be clear when the input data DIN changes. In addition, by adjusting the number of the optional signals output by the OCD pre-driver 140, the current intensity of the compensation signal Pout, Nout can be controlled to meet actual demand.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:
1. An off chip driver circuit, comprising:
 a pull-up circuit, configured to be enabled in response to an input data;
 a pull-down circuit, configured to be enabled in response to the input data;

a first compensation circuit, coupled to the pull-up circuit, configured to induce a first compensation signal to the pull-up circuit in response to a first decision signal; and a second compensation circuit, coupled to the pull-down circuit, configured to induce a second compensation signal to the pull-down circuit in response to a second decision signal, wherein the first decision signal and the second decision signal are generated in response to the input data, wherein the first compensation circuit comprises a plurality of first compensation components connected in parallel, the first compensation components comprise a plurality of first transistors, the first transistors are configured to be conducted according to a plurality of first enable signals so as to induce the first compensation signal, and the second compensation circuit comprises a plurality of second compensation components connected in parallel, the second compensation components comprise a plurality of second transistors, the second transistors are configured to be conducted according to a plurality of second enable signals so as to induce the second compensation signal, wherein the current intensity of the first compensation signal is according to the number of a plurality of first optional signals configured to generate the corresponding number of the first enable signals so as to conduct the corresponding number of the first compensation components, and the current intensity of the second compensation signal is according to the number of a plurality of second optional signals configured to generate the corresponding number of the second enable signals so as to conduct the corresponding number of the second compensation components.

2. The off chip driver circuit of claim 1, wherein
the first compensation circuit further comprises a first logic gate, the first logic gate is configured to generate the first enable signal according to the first decision signal and a first optional signal to output the first enable signal to the first transistor, and
the second compensation circuit further comprises a second logic gate, the second logic gate is configured to generate the second enable signal according to the second decision signal and a second optional signal to output the second enable signal to the second transistor.

3. The off chip driver circuit of claim 2, wherein
the first logic gate is a NAND gate and the second logic gate is a NOR gate.

4. The off chip driver circuit of claim 1, wherein
the first compensation circuit further comprises a first multiplexer, the first multiplexer is configured to generate the first enable signal according to the first decision signal and a first optional signal to output the first enable signal to the first transistor, and
the second compensation circuit further comprises a second multiplexer, the second multiplexer is configured to generate the second enable signal according to the second decision signal and a second optional signal to output the second enable signal to the second transistor.

5. The off chip driver circuit of claim 1, wherein the numbers of the first transistors included by different first compensation components are different, and the numbers of the second transistors included by different second compensation components are different.

6. An off chip driver compensation system, comprising:
a decision circuit, configured to output a first decision signal and a second decision signal according to a clock and an input data; and an OCD driver circuit, coupled to the decision circuit, the OCD driver circuit comprising:
a pull-up circuit, configured to be enabled in response to the input data;
a pull-down circuit, configured to be enabled in response to the input data;
a first compensation circuit, coupled to the pull-up circuit, configured to induce a first compensation signal to the pull-up circuit in response to the first decision signal;
a second compensation circuit, coupled to the pull-down circuit, configured to induce a second compensation signal to the pull-down circuit in response to the second decision signal; and
a pre-driving circuit, coupled between the decision circuit and the OCD driver circuit, configured to output at least one first optional signal and at least one second optional signal to the first compensation circuit and the second compensation circuit respectively,
wherein the first compensation circuit comprises a plurality of first compensation components connected in parallel, the first compensation components comprise a plurality of first transistors, the first transistors are configured to be conducted according to a plurality of first enable signals so as to induce the first compensation signal, and the second compensation circuit comprises a plurality of second compensation components connected in parallel, the second compensation components comprise a plurality of second transistors, the second transistors are configured to be conducted according to a plurality of second enable signals so as to induce the second compensation signal.

7. The off chip driver compensation system of claim 6, wherein the decision circuit is configured to generate the first decision signal with a high level when the input data turns from a first level to a second level, and to generate the second decision signal with a low level when the input data turns from the second level to the first level.

8. The off chip driver compensation system of claim 6, wherein
the first compensation circuit further comprises a first logic gate, the first logic gate is configured to generate the first enable signal according to the first decision signal and a first optional signal to output the first enable signal to the first transistor, and
the second compensation circuit further comprises a second logic gate, the second logic gate is configured to generate the second enable signal according to the second decision signal and a second optional signal to output the second enable signal to the second transistor.

9. The off chip driver compensation system of claim 6, wherein the numbers of the first transistors of the different first compensation components are different, and the numbers of the second transistors of the different second compensation components are different.

10. The off chip driver compensation system of claim 6, wherein
the current intensity of the first compensation signal is according to the number of the first optional signals configured to generate the corresponding number of the first enable signals so as to conduct the corresponding number of the first compensation components, and
the current intensity of the second compensation signal is according to the number of the second optional signals configured to generate the corresponding number of the second enable signals so as to conduct the corresponding number of the second compensation components.

11. A signal compensation method, comprising:
enabling a pull-up circuit in response to an input data;
turning a first decision signal to a high level when the input data turns from a first level to a second level;
conducting a plurality of first compensation components which are connected in parallel and coupled to the pull-up circuit according to a plurality of first enable signals and the first decision signal so as to induce a first compensation signal to the pull-up circuit;
enabling a pull-down circuit in response to the input data;
turning a second decision signal to a low level when the input data turns from the second level to the first level; and
conducting a plurality of second compensation components which are connected in parallel and coupled to the pull-down circuit according to a plurality of second enable signals and the first decision signal so as to induce a second compensation signal to the pull-down circuit,
wherein the current intensity of the first compensation signal is according to the number of a plurality of first optional signals configured to generate the corresponding number of the first enable signals so as to conduct the corresponding number of the first compensation components, and the current intensity of the second compensation signal is according to the number of a plurality of second optional signals configured to generate the corresponding number of the second enable signals so as to conduct the corresponding number of the second compensation components.

12. A driver, comprising:
a decision circuit, configured to provide a decision signal in response to a clock and an input data;
a driving circuit configured to provide a driving signal in response to the input data; and
a compensation circuit, coupled to the driving circuit, configured to induce a compensation signal to the driving circuit in response to the decision signal,
wherein the compensation circuit comprises a plurality of compensation components connected in parallel, the compensation components comprise a plurality of transistors, the transistors are configured to be conducted according to a plurality of enable signals so as to induce the compensation signal, the current intensity of the compensation signal is according to the number of a plurality of optional signals configured to generate the corresponding number of the enable signals so as to conduct the corresponding number of the compensation components.

13. The driver of claim 12, wherein the transistors are configured to be conducted according to the enable signals so as to provide a system voltage as the compensation signals.

14. The driver of claim 13, wherein the compensation circuit further comprises a logic gate, the logic gate is configured to generate the enable signal in response to the decision signal and the optional signal.

15. The driver of claim 13, wherein the compensation circuit further comprises a multiplexer, the multiplexer is configured to generate the enable signal in response to the decision signal and the optional signal.

16. The driver of claim 12, wherein the numbers of the transistors included by different compensation components are different.

* * * * *